United States Patent
Sada et al.

(10) Patent No.: US 10,763,230 B2
(45) Date of Patent: Sep. 1, 2020

(54) INTEGRATED CIRCUIT BACKSIDE METALLIZATION

(71) Applicant: TEXAS INSTRUMENTS INCORPORATED, Dallas, TX (US)

(72) Inventors: Hiroyuki Sada, Beppu (JP); Shoichi Iriguchi, Beppu (JP); Genki Yano, Beppu (JP); Luu Thanh Nguyen, San Jose, CA (US); Ashok Prabhu, San Jose, CA (US); Anindya Poddar, Sunnyvale, CA (US); Yi Yan, Sunnyvale, CA (US); Hau Nguyen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/228,962

(22) Filed: Dec. 21, 2018

(65) Prior Publication Data

US 2020/0203295 A1    Jun. 25, 2020

(51) Int. Cl.
*H01L 21/78* (2006.01)
*H01L 21/683* (2006.01)
(Continued)

(52) U.S. Cl.
CPC .............. *H01L 24/03* (2013.01); *H01L 21/78* (2013.01); *H01L 24/05* (2013.01); *H01L 21/6836* (2013.01); *H01L 23/495* (2013.01); *H01L 23/49513* (2013.01); *H01L 24/32* (2013.01); *H01L 24/48* (2013.01); *H01L 24/73* (2013.01); *H01L 2221/68336* (2013.01); *H01L 2224/03015* (2013.01); *H01L 2224/0331* (2013.01); *H01L 2224/04026* (2013.01); *H01L 2224/05082* (2013.01); *H01L 2224/05155* (2013.01); *H01L 2224/05166* (2013.01); *H01L 2224/05171* (2013.01); *H01L 2224/05563* (2013.01); *H01L 2224/05639* (2013.01); *H01L 2224/32245* (2013.01); *H01L 2224/48175* (2013.01); *H01L 2224/73265* (2013.01)

(58) Field of Classification Search
CPC ......... H01L 24/03; H01L 24/05; H01L 24/32; H01L 24/48; H01L 24/73; H01L 21/6836; H01L 21/78; H01L 23/495; H01L 23/49513; H01L 2221/68336; H01L 2224/03015; H01L 2224/0331; H01L 2224/04026; H01L 2224/05082; H01L 2224/05155; H01L 2224/05166; H01L 2224/05171; H01L 2224/05563; H01L 2224/05639; H01L 2224/32245; H01L 2224/48175; H01L 2224/73265
USPC ........................................................ 257/620
See application file for complete search history.

(56) References Cited

U.S. PATENT DOCUMENTS

2017/0250158 A1* 8/2017 Chinnusamy ......... H01L 21/561

\* cited by examiner

*Primary Examiner* — Tong-Ho Kim
(74) *Attorney, Agent, or Firm* — Dawn Jos; Charles A. Brill; Frank D. Cimino (57) ABSTRACT

A method for backside metallization includes inkjet printing a pattern of nanosilver conductive ink on a first surface of a silicon wafer. The silicon wafer includes a plurality of dies. The pattern includes a clearance area along a scribe line between the dies. A laser is focused, through a second surface of the wafer, at a point between the first surface of the silicon wafer and the second surface of the silicon wafer. The second surface is opposite the first surface. The dies are separated along the scribe line.

8 Claims, 7 Drawing Sheets

(51) Int. Cl.
*H01L 23/00* (2006.01)
*H01L 23/495* (2006.01)

INTEGRATED CIRCUIT BACKSIDE METALLIZATION

BACKGROUND

In integrated circuit fabrication, multiple dies are formed on a semiconductor wafer (e.g., a silicon wafer). Prior to separation of the dies from the wafer, a layer of metal may be deposited on the backside of the wafer. The backside of the wafer is opposite the side of the wafer on which active components are formed. Backside metallization provides an electrically conductive contact and/or a heat conductive contact for the dies. Backside metallization is often employed in power devices to provide improved heat dissipation.

SUMMARY

A method for fabricating a semiconductor device with metallization of the backside of a wafer that facilitates stealth dicing, and dies and packaged devices produced by the method are disclosed herein. In one example, a method for fabricating a semiconductor device includes inkjet printing a pattern of nanosilver conductive ink on a first surface of a silicon wafer. The silicon wafer includes a plurality of dies. The pattern includes a clearance area along a scribe line between the dies. A laser is focused, through a second surface of the wafer, at a point between the first surface of the silicon wafer and the second surface of the silicon wafer. The second surface is opposite the first surface. The dies are separated along the scribe line.

In another example, a packaged semiconductor device includes a die attach pad, a silicon die, and a case. The silicon die is bonded to the die attach pad. The silicon die includes a silicon substrate and a metalized backside. The metallized backside includes a layer of cured nanosilver conductive ink extending to a predetermined clearance distance from each edge of the silicon substrate. The case surrounds the die attach pad and the silicon die.

In a further example, an integrated circuit includes a silicon substrate and a metallized backside. The metallized backside includes a layer of cured nanosilver conductive ink extending to a predetermined clearance distance from each edge of the silicon substrate.

BRIEF DESCRIPTION OF THE DRAWINGS

For a detailed description of various examples, reference will now be made to the accompanying drawings in which.

DETAILED DESCRIPTION

The following discussion is directed to various exemplary implementations. However, one of ordinary skill in the art will understand that the examples disclosed herein have broad application, and that the discussion of any implementation is meant only to be exemplary of that implementation, and not intended to suggest that the scope of the disclosure, including the claims, is limited to that implementation.

The drawing figures are not necessarily to scale. Certain features and components illustrated in the drawings may be shown exaggerated in scale or in somewhat schematic form and some details may not be shown in interest of clarity and conciseness.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "approximately" is intended to mean in range of +1-10% of a stated value. Thus, a value of approximately 10 micrometers specifies a range of 9 micrometers to 11 micrometers.

Some implementations of backside metallization deposit one or more layers of metal that cover the entirety of the wafer's backside. For example, an adhesion layer, a barrier layer, and a wetting layer may be deposited where each of the layers covers the entire surface of the wafer's backside. Such wafers may be diced using a sawblade without difficulty. Stealth (or Mahoh) dicing uses a laser focused at a point beneath the surface of the wafer (i.e., focused on the interior of the wafer) to for a stealth dicing layer in the interior of the wafer at the boundaries of the dies (i.e., along a scribe line.) After laser processing, the dicing tape to which the wafer is attached is expanded, and the dies separate along the stealth dicing layer. In wafers having blanket backside metallization, the metal layers may inhibit separation of the dies using stealth dicing.

The method for backside metallization disclosed herein deposits thin adhesion and barrier layers that do not inhibit stealth dicing over the entire backside of the wafer. For example, the deposited adhesion and barrier layers may each have a thickness in a range of 0.05 to 0.05 micrometers. A thicker wetting layer is applied by inkjet printing a pattern of nanosilver conductive ink over the barrier layer. Nanosilver conductive ink is ink that includes silver particles with dimension in the nanometer range. Other components in the ink typically include a solvent with a small concentration of surfactant. The solvent controls the viscosity of the ink to allow for ink jettability, while the surfactant is required to prevent particle agglomeration that impacts the jetting consistency and quality. The pattern substantially covers the backside of each die, but leaves an unprinted clearance area along the scribe lines between the dies. The unprinted clearance area allows the dies to separate along the scribe lines and the nanosilver conductive ink provides electrical and/or thermal conductivity. Because inkjet printing is an additive manufacturing process, material waste is reduced and no masking or etching steps are needed. Moreover, because larger wafers (e.g., 300 millimeter wafers) can be processed using inkjet printing, the need for expensive metal deposition equipment for such wafers is reduced, which in turn reduces the cost of manufacturing.

Figure 1:
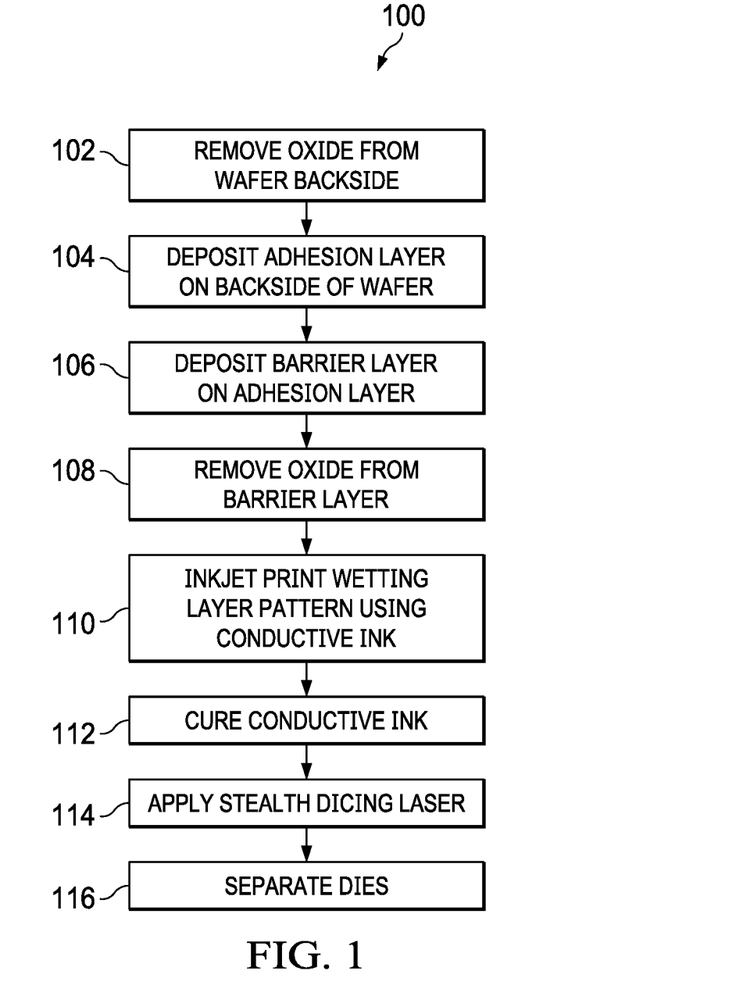
FIG. 1 shows a flow diagram for an example method of backside metallization using inkjet printing in accordance with the present disclosure.

FIG. 1 shows a flow diagram for an example method 100 of backside metallization using inkjet printing in accordance with the present disclosure. Though depicted sequentially as a matter of convenience, at least some of the actions shown can be performed in a different order and/or performed in parallel. Additionally, some implementations of the method 100 may perform only some of the actions shown.

In block 102, the backside 204 of the wafer 200 is cleaned to remove any oxide that may have formed on the outer surface of the backside 204. The presence of oxide may increase the resistance of contact with the backside 204, which in turn may affect the performance of the finished device. Sputtering may be applied to remove oxide in some implementations.

Figure 2A:
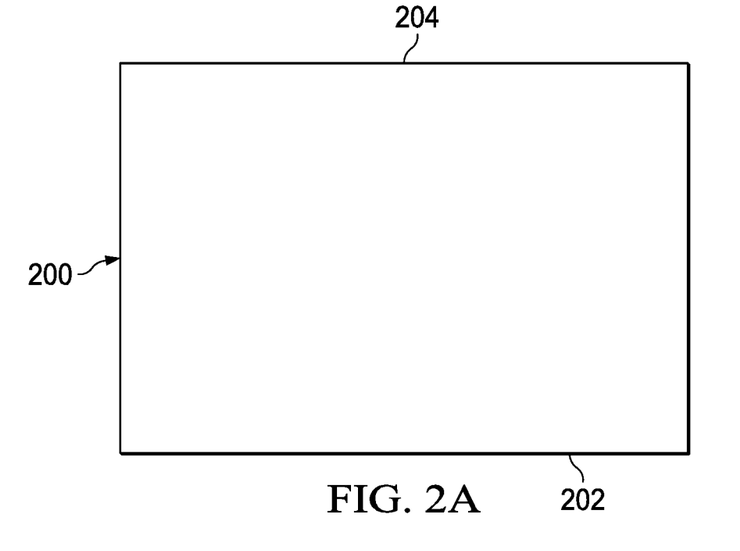
FIGS. 2A-2F show operations performed in an example method of backside metallization using inkjet printing in accordance with the present disclosure.
Figure 2B:
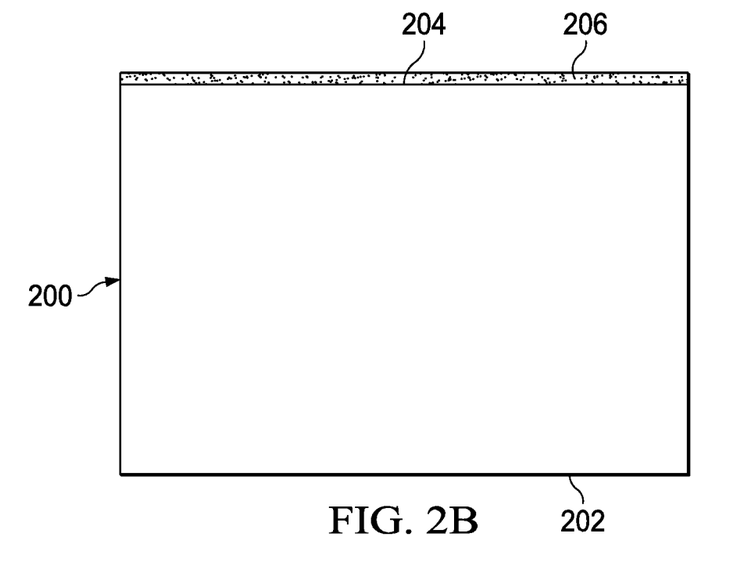

In block 104, electronic components of multiple dies have been fabricated on a wafer. FIG. 2A shows a wafer 200 (i.e., a silicon wafer). The wafer 200 includes an active side 202, on which the electronic components are formed, and a backside 204. Material is blanket deposited on the backside 204 of the wafer 200 to form an adhesion layer. FIG. 2B shows an adhesion layer 206 deposited on the backside 204 of the wafer 200. The material deposited to form the adhesion layer 206 may be, for example, titanium, chromium, or other material that adheres to (e.g., interdiffuses or alloys with) the silicon (or silicon dioxide) of the backside 204 of the wafer 200. Deposition may be by sputtering, evaporation, or other metal deposition process. The adhesion layer 206 is relatively thin, and in some implementations, the thickness of the adhesion layer 206 may be in a range of approximately 0.1 to 0.2 micrometers (μm).

Figure 2C:
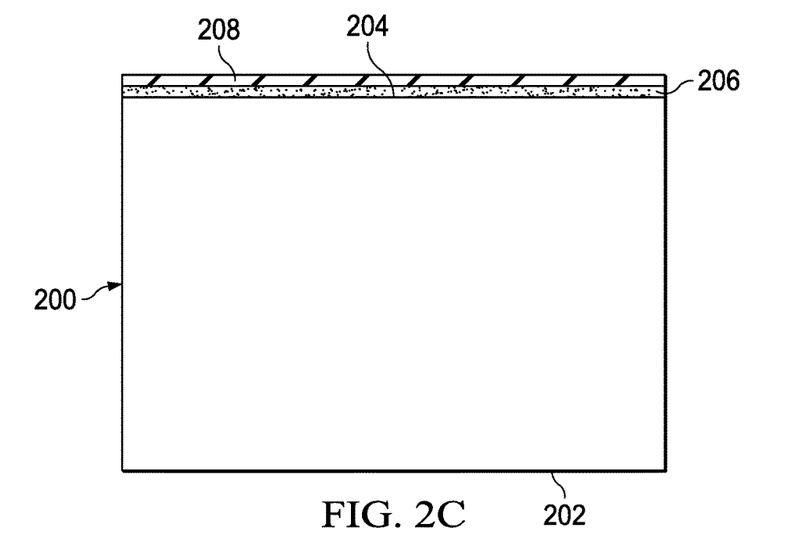

In block 106, material is blanket deposited on the adhesion layer 206 to form a barrier layer. FIG. 2C shows a barrier layer 208 deposited on the adhesion layer 206. The material deposited to form the barrier layer 208 may be, for example, nickel or other material that inhibits diffusion. Deposition may be by sputtering, evaporation, or other metal deposition process. The barrier layer 208 is relatively thin, and in some implementations, the thickness of the barrier layer 208 may be in a range of approximately 0.1 to 0.2 μm. The barrier layer prevents titanium or chromium of the adhesion layer from oxidizing or diffusing to the outer surface of the wafer.

In block 108, the barrier layer 208 is cleaned to remove any oxide that may have formed on the outer surface of the barrier layer 208. In some implementations of the method 100, an atmospheric plasma is applied to the barrier layer 208 to remove oxide. Removal of the oxide promotes adhesion of the wetting layer to be deposited atop the barrier layer 208 in block 110.

Figure 2D:
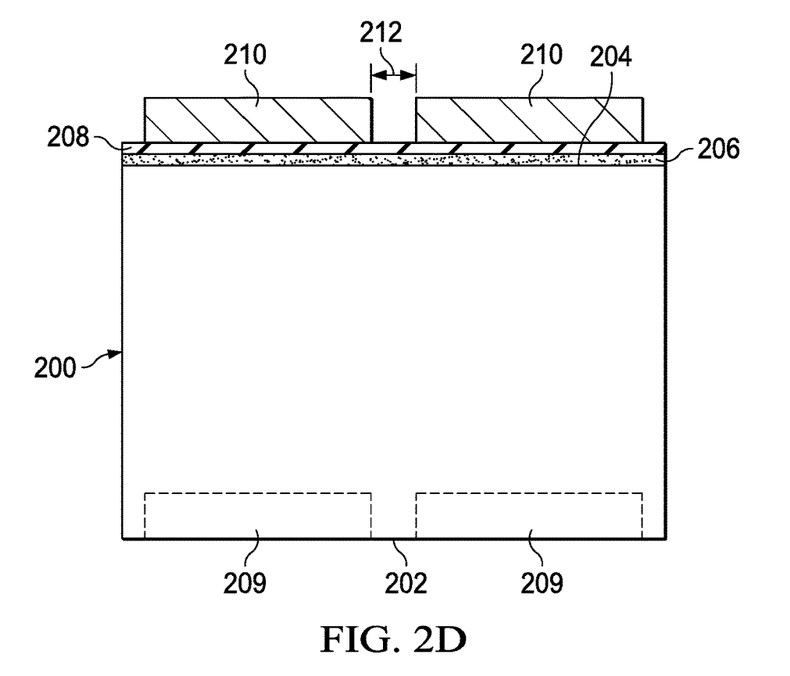

In block 110, a pattern is deposited on the barrier layer 208 by inkjet printing to form a solderable wetting layer. The wetting layer acts as a bonding layer for an adhesive used to bond the die to a die attach pad. FIG. 2D shows a wetting layer 210 deposited on the barrier layer 208. The material deposited to form the wetting layer 210 may be nanosilver conductive ink or other suitable conductive ink. The wetting layer 210 may be relatively thick (in comparison to the adhesion layer 206 or the barrier layer 208). In some implementations of the method 100, the thickness of the wetting layer 210 may be in a range of approximately 0.4 to 0.6 μm. The pattern of the wetting layer 210 provides nanosilver conductive ink in areas of the backside 204 that correspond to the location of electronic components on the active side 202. In FIG. 2D, areas 209 correspond to electronic components of different dies formed on the active side 202 of the wafer 200. The pattern of the wetting layer 210 provides a clearance area 212 in which no nanosilver conductive ink is printed in areas bounding two dies formed on the wafer 200. That is, the pattern of the wetting layer 210 provides a clearance area 212 in which no nanosilver conductive ink is printed along the scribe lines between the dies formed on the wafer 200. The dies formed on the wafer 200 are to be separated along the scribe lines. In some implementations of the method 100, the clearance area 212 may be approximately 10-30 μm in width.

The inkjet printer that dispenses the wetting layer 210 includes a high-resolution infrared camera that detects, through the backside 204 of the wafer 200, positioning structures disposed on the active side 202 of the wafer 200. For example, the camera may detect fiducial marks or structures provided on the active side 202 of the wafer 200 to identify the locations of the scribe lines between the dies formed on the wafer 200. Having determined the locations of the scribe lines, the inkjet printer dispenses conductive ink across the backside 204 of the wafer 200 while leaving the clearance area 212 about the scribe lines free of conductive ink.

In block 112, the wetting layer 210 is cured by heating the wafer 200 in an oven. The heating promotes evaporation of solvents and other materials in the nanosilver conductive ink leaving the sintered nanosilver on the backside 204 of the wafer 200.

Figure 2E:
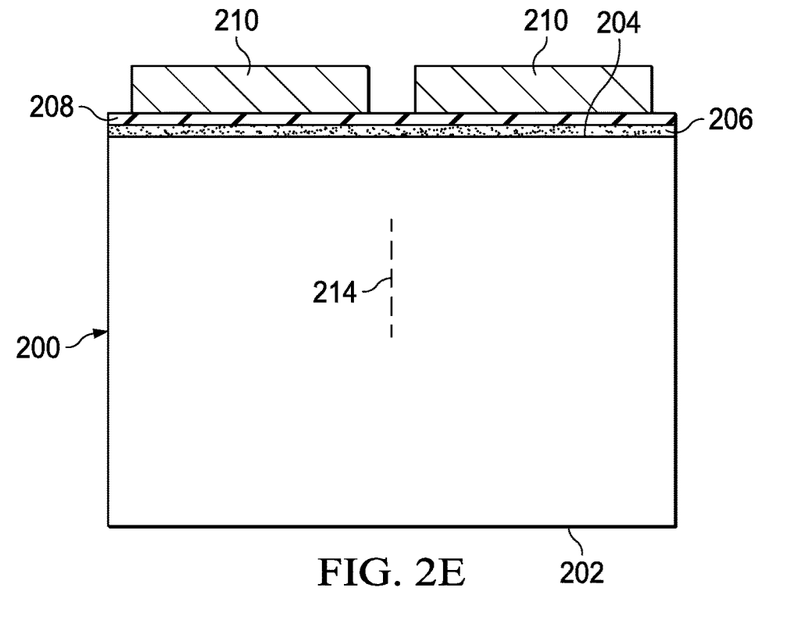

In block 114, a stealth dicing laser is applied to the wafer 200. The stealth dicing laser is focused on the interior of the wafer 200 through the active side 202 of the wafer 200. The depth of focus depends on wafer thickness, laser power, beam width, and/or other factors. For example, the depth of focus may vary from 20 micrometers to over 100 micrometers from the outer surface of the wafer. The stealth dicing laser is moved along the scribe lines of the wafer 200 to form a polycrystalline silicon layer (i.e., a stealth dicing layer) in the interior of the wafer 200 along the scribe lines. FIG. 2E shows the polycrystalline silicon layer 214 created in the interior of the wafer 200 by the stealth dicing laser. The laser converts the single crystal silicon of the wafer 200 to polycrystalline silicon to form the easily broken polycrystalline silicon layer within the wafer. FIG. 2E shows the polycrystalline silicon layer 214 created in the interior of the wafer 200 by the stealth dicing laser.

Some implementations of the method 100 may employ a dicing saw rather a laser to separate the dies. In such implementations, the clearance area 212 provided about the scribe lines between the dies may be approximately 60-100 um (or greater) in width.

Figure 2F:
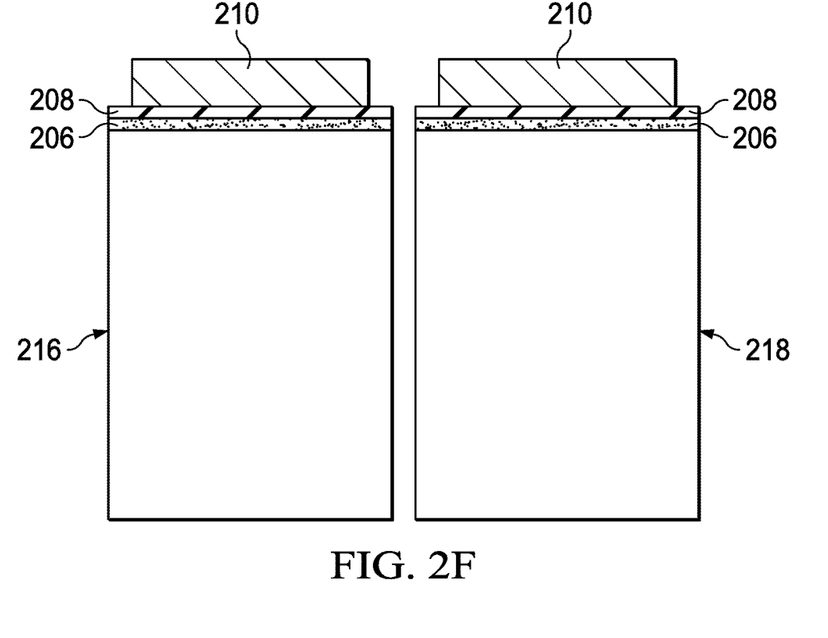

In block 116, the dies are separated from the wafer 200 along the scribe lines between the dies (i.e., along the polycrystalline silicon layer 214). The dies may be separated by expanding a dicing tape to which the backside 204 of the wafer 200 is mounted. FIG. 2F shows die 216 and die 218 separated from the wafer 200.

By patterning the nanosilver conductive ink so that the clearance area 212 is provided along the scribe lines between the dies formed on the wafer 200, the dies 216 and 218 may be separated from the wafer 200 by stealth dicing while the backside of each die is substantially covered by a nanosilver wetting layer that provides good electrical and thermal conduction. Without the clearance area 212 provided by the inkjet printed wetting layer 210, separation of the dies through the relatively thick wetting layer 210 using stealth dicing would be problematic.

Figure 3A:
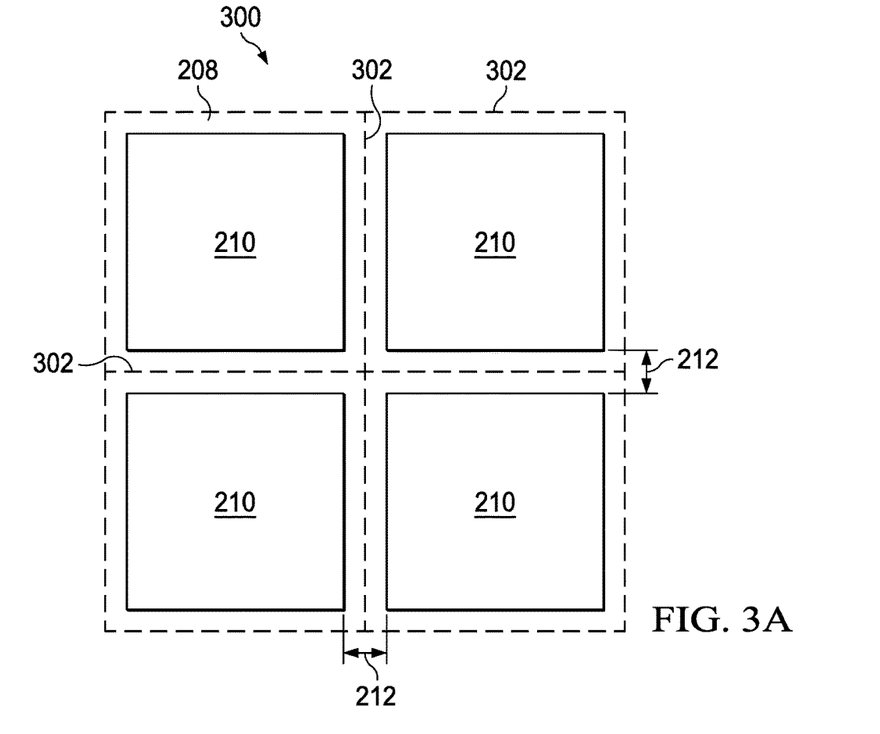
FIGS. 3A and 3B show top and front views of an example wafer fabricated using backside metallization provided via inkjet printing in accordance with the present disclosure.
Figure 3B:
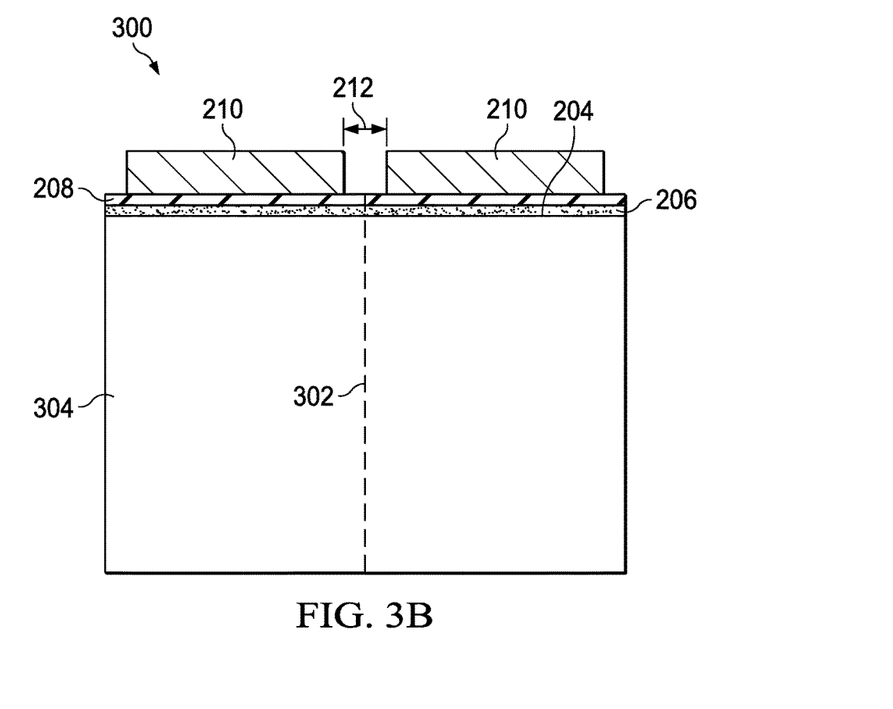

FIGS. 3A and 3B show top and side views of an example wafer 300 fabricated using backside metallization provided via inkjet printing in accordance with the present disclosure. FIG. 3A shows a top view of the backside of the wafer 300.

In FIG. 3A, the backside of the wafer 300 is shown for four of the dies formed on the wafer 300. In practice, any number of dies may be formed on the wafer 300. The wetting layer 210 has been inkjet printed on the backside of the wafer 300. The wetting layer 210 provides nanosilver conductive ink that substantially covers the backside of each die, and provides a clearance area 212 along the scribe lines 302 that define the boundaries of the dies. The barrier layer 208 is exposed in the clearance area 212. The clearance area 212 may be approximately 10-30 μm in width in some implementations of the wafer 300.

FIG. 3B shows a side view of the wafer 300. The adhesion layer 206 is disposed on the backside 204 of the wafer 300 adjacent the silicon substrate 304. The barrier layer 208 is disposed on the adhesion layer 206 between the adhesion layer 206 and the wetting layer 210. The wetting layer 210 is disposed on the barrier layer 208. The wetting layer 210 includes the clearance area 212 at the scribe line 302 between dies. The adhesion layer 206 and the barrier layer 208 may each be approximately 0.1 to 0.2 μm in thickness. The wetting layer 210 may be approximately 0.4 to 0.6 μm in thickness.

Figure 4A:
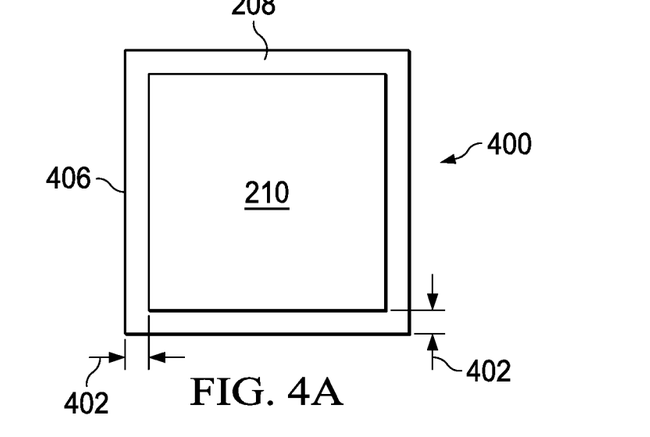
FIGS. 4A and 4B show top and side views of an example die fabricated using backside metallization provided via inkjet printing in accordance with the present disclosure.
Figure 4B:
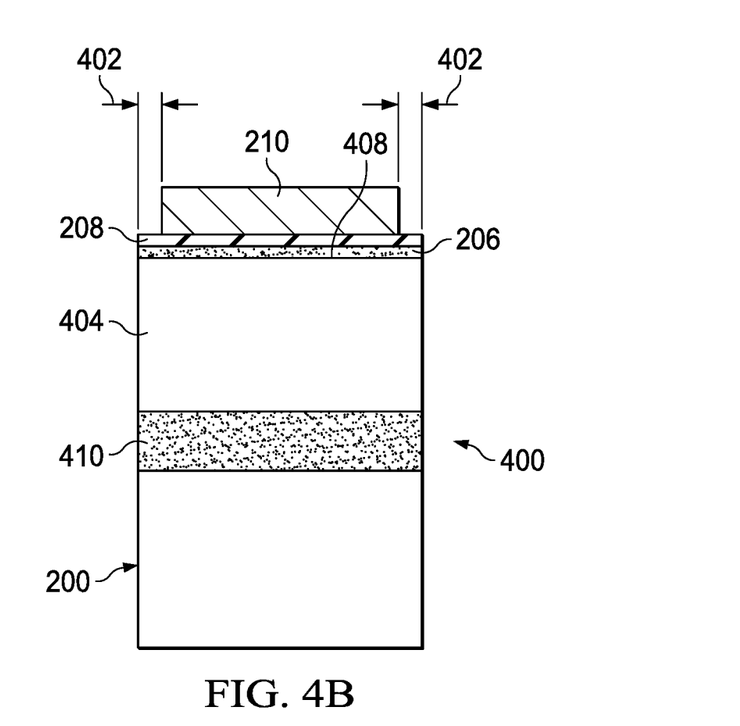

FIGS. 4A and 4B show top and front views of an example die 400 (also referred to herein as integrated circuit 400) fabricated using backside metallization that includes inkjet printing in accordance with the present disclosure. FIG. 4A shows a top view of the backside of the die 400. In FIG. 4A, the backside of the 400 includes the wetting layer 210 formed of cured conductive ink (e.g., nanosilver conductive ink) disposed on the barrier layer 208. Because the pattern of the wetting layer 210 printed in the backside of the die 400 includes a clearance area (e.g., clearance area 212 shown in FIG. 3) about the scribe line, the conductive ink of the wetting layer 210 does not extend all the way to the edge 406 of the die 400. Instead, the conductive ink of the wetting layer 210 extends to a predetermined clearance distance 402 from the edge of the die 400 (i.e., from the edge of the silicon substrate 404). The predetermined clearance distance 402 may be in a range of approximately 5 to 15 μm in some implementations of the die 400. The barrier layer 208 is exposed from the edge 406 of the die 400 to the edge of the conductive ink of the wetting layer 210.

FIG. 4B shows a front view of the die 400. The adhesion layer 206 is disposed on the backside 408 of the die 400 adjacent the silicon substrate 404. The barrier layer 208 is disposed on the adhesion layer 206 between the adhesion layer 206 and the wetting layer 210. The wetting layer 210 is disposed on the barrier layer 208. The wetting layer 210 includes the predetermined clearance distance 402 at the edge 406 of die 400. The adhesion layer 206 and the barrier layer 208 may each be approximately 0.1 to 0.2 μm in thickness. The conductive ink of the wetting layer 210 may be approximately 0.4 to 0.6 μm in thickness. A layer of polycrystalline silicon 410 formed within the silicon substrate 404 by the laser dicing may be visible at an edge of the silicon substrate 404. Any number of layers of polycrystalline silicon 410 may be present depending of the number of laser passes applied to dice the wafer.

Figure 5:
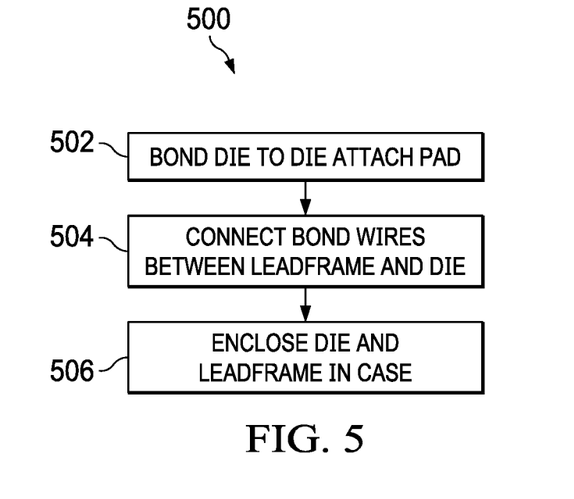
FIG. 5 shows a flow diagram for a method for fabricating a semiconductor device in accordance with the present disclosure.

FIG. 5 shows a flow diagram for a method 500 for fabricating a semiconductor device in accordance with the present disclosure. Though depicted sequentially as a matter of convenience, at least some of the actions shown can be performed in a different order and/or performed in parallel. Additionally, some implementations may perform only some of the actions shown. The method 500 may include the operations of the method 100 to prepare the die 400 for use in the method 500.

In block 502, a silicon die 400 is bonded to a die attach pad of a lead frame. The silicon die may be prepared using the method 100 to add a backside metal layer that facilitates stealth dicing. The silicon die may be bonded to the die attach pad using an epoxy-based adhesive.

In block 504, the silicon die 400 is electrically connected to the lead fame 102 by attaching bond wires to terminals of the die 400 and terminals of the lead frame.

In block 506, the silicon die 400, the bond wires, and the lead frame are enclosed in a case. For example, the silicon die 400, the bond wires, and the lead frame are encapsulated in a molding compound.

Figure 6:
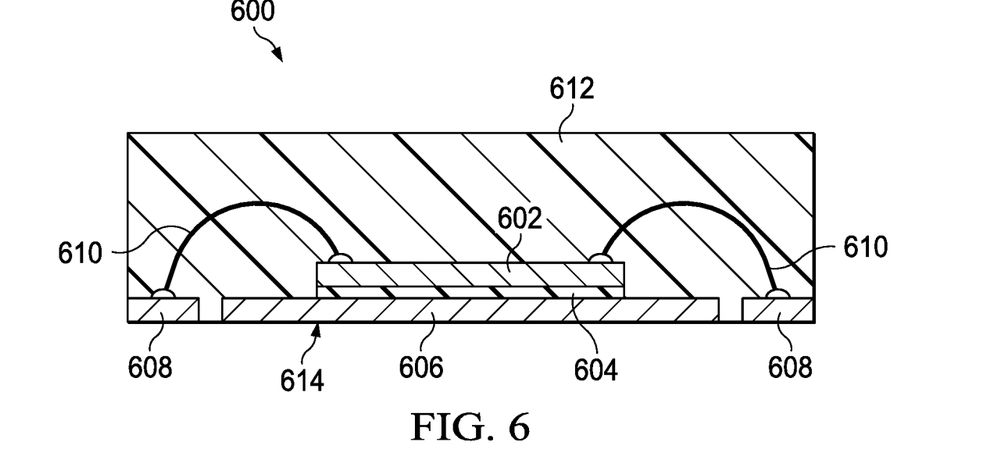
FIG. 6 shows a packaged semiconductor device in accordance with the present disclosure.

FIG. 6 shows a packaged semiconductor device 600 in accordance with the present disclosure. The 600 includes a silicon die 602 and a lead frame 614. The silicon die 602 is an implementation of the die 400. The lead frame 614 includes a die attach pad 606 and terminals 608. The silicon die 602 is bonded to the die attach pad by adhesive 604. Bond wires 610 electrically couple the silicon die 602 to the terminals 608. Case 612 surrounds the silicon die 602, the bond wires 610, and at least a portion of the lead frame 614 (including at least a portion of the die attach pad 606).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for fabricating a semiconductor device, comprising:
    inkjet printing a pattern of nanosilver conductive ink on a first surface of a silicon wafer comprising a plurality of dies, the pattern comprising a clearance area along a scribe line between the dies;
    focusing a laser, through a second surface of the wafer, at a point between the first surface of the silicon wafer and the second surface of the silicon wafer, wherein the second surface is opposite the first surface, and the point is aligned with the clearance area; and
    separating the dies along the scribe line.

2. The method of claim 1, further comprising depositing an adhesion layer on the first side of the silicon wafer.

3. The method of claim 2, further comprising depositing a barrier layer on the adhesion layer.

4. The method of claim 3, wherein the inkjet printing comprises printing the pattern of nanosilver conductive ink on the barrier layer, wherein the clearance area exposes the barrier layer.

5. The method of claim 3, further comprising applying an atmospheric plasma to remove oxide from the barrier layer.

6. The method of claim 1, further comprising curing the printed pattern of nanosilver conductive ink.

7. The method of claim 1, further comprising detecting, through the silicon wafer, fiducial marks on the second surface of the silicon wafer to align an inkjet print nozzle to dispense the pattern of nanosilver conductive ink.

8. The method of claim 1, further comprising:
    bonding a given one of the dies to the die attach pad of a lead frame;
    electrically coupling the given one of the dies to terminals of the lead frame via bond wires; and
    enclosing the given one of the dies, the bond wires, and at least a portion of the lead frame in a case.

* * * * *